United States Patent
Kinoshita et al.

(10) Patent No.: US 7,538,427 B2
(45) Date of Patent: May 26, 2009

(54) MICROCHANNEL STRUCTURE AND MANUFACTURING METHOD THEREFOR, LIGHT SOURCE DEVICE, AND PROJECTOR

(75) Inventors: Satoshi Kinoshita, Matsumoto (JP); Akira Egawa, Shiojirishi (JP)

(73) Assignee: Seiko Epson Corporation, Tokyo (JP)

( * ) Notice: Subject to any disclaimer, the term of this patent is extended or adjusted under 35 U.S.C. 154(b) by 300 days.

(21) Appl. No.: 11/344,186

(22) Filed: Feb. 1, 2006

(65) Prior Publication Data

US 2006/0214092 A1    Sep. 28, 2006

(30) Foreign Application Priority Data

Mar. 8, 2005    (JP)    ............... 2005-063612
Nov. 15, 2005    (JP)    ............... 2005-329858

(51) Int. Cl.
*H01L 23/34*    (2006.01)
*H01L 31/0203*    (2006.01)

(52) U.S. Cl. ................ 257/714; 257/713; 257/706; 257/434; 257/E23.098

(58) Field of Classification Search ............. 257/713, 257/706, 434, 680, 714, E23.098; 362/294
See application file for complete search history.

(56) References Cited

U.S. PATENT DOCUMENTS

| | | | | |
|---|---|---|---|---|
| 5,309,457 | A | * | 5/1994 | Minch ................ 372/34 |
| 5,355,942 | A | * | 10/1994 | Conte ............. 165/104.33 |
| 6,780,678 | B2 | * | 8/2004 | Simon et al. ........... 438/122 |
| 7,204,298 | B2 | * | 4/2007 | Hodes et al. ........... 165/80.4 |
| 2003/0086454 | A1 | * | 5/2003 | Nagano et al. ........... 372/35 |
| 2004/0120827 | A1 | * | 6/2004 | Kim et al. .............. 417/48 |
| 2005/0211418 | A1 | * | 9/2005 | Kenny et al. .......... 165/80.4 |
| 2005/0276053 | A1 | * | 12/2005 | Nortrup et al. .......... 362/294 |

FOREIGN PATENT DOCUMENTS

| EP | 0 687 870 A1 | 12/1995 |
|---|---|---|
| JP | U 61-84389 | 6/1986 |
| JP | A 7-307423 | 11/1995 |
| JP | A 10-93277 | 4/1998 |
| JP | A 2004-295718 | 10/2004 |
| JP | A 2004-354633 | 12/2004 |
| JP | A 2004-354634 | 12/2004 |
| JP | A 2004-361496 | 12/2004 |
| JP | A 2004-361569 | 12/2004 |

* cited by examiner

*Primary Examiner*—Nitin Parekh
(74) *Attorney, Agent, or Firm*—Oliff & Berridge, PLC

(57) ABSTRACT

A microchannel structure that has plural microchannels through which fluid flows, including: a housing section formed in a block; and a pipe array arranged in the housing section and formed by stacking plural pipes.

13 Claims, 14 Drawing Sheets

F I G. 1 3
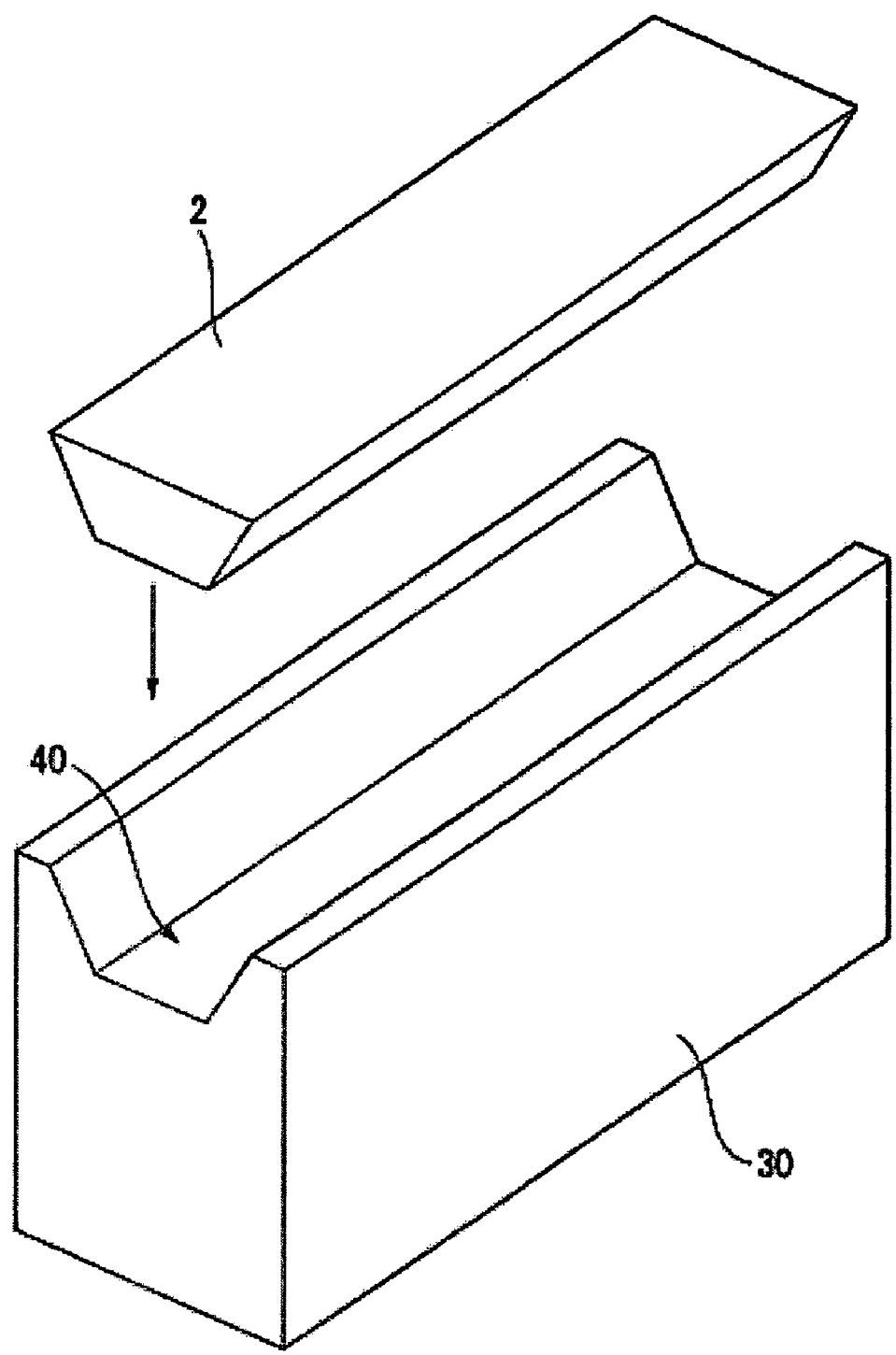

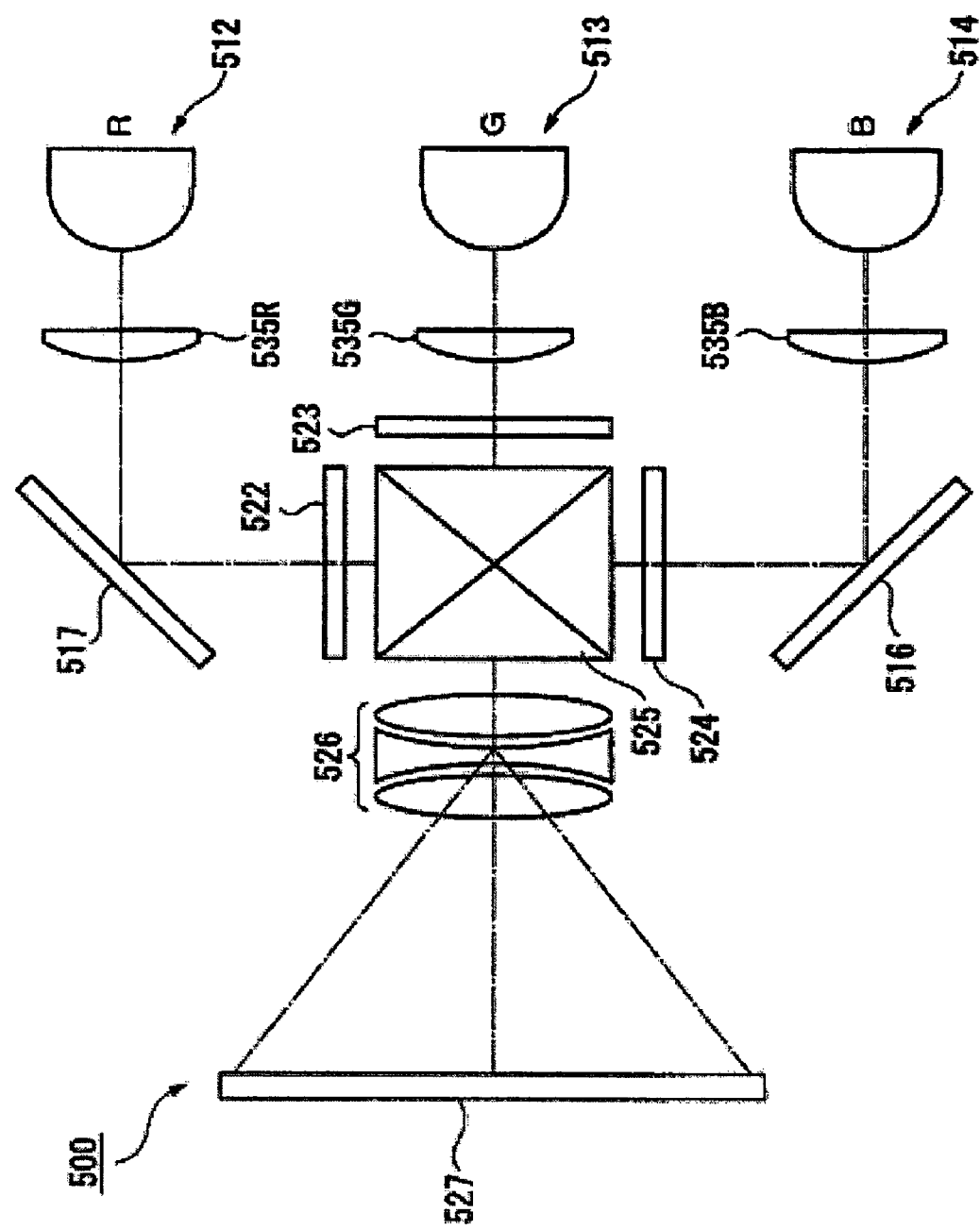
F I G. 2 2

MICROCHANNEL STRUCTURE AND MANUFACTURING METHOD THEREFOR, LIGHT SOURCE DEVICE, AND PROJECTOR

BACKGROUND

1. Technical Field

The present invention relates to a microchannel structure and a manufacturing method therefor, a light source device, and a projector.

2. Related Art

A microchannel structure is a structure including microchannels having a width of several micrometers to several hundred micrometers and is used for various applications. For example, the microchannel structure is used as a heat exchange component realizing high cooling performance by feeding a cooling medium (fluid) through the microchannels or used as a carrying path for fluid with a low flow rate.

For example, in the case of a heat exchanger that is a structure including plural channels with a width of several millimeters to several centimeters, as described in JP-UM-A-61-84389, it is possible to manufacture the heat exchanger at low cost and in a large quantity by housing and arranging a corrugate board member, which is formed by pressing, in a housing section of an outer peripheral wall member.

However, microprocessing is difficult in the pressing. Moreover, it is difficult to form channels with a high aspect ratio (a ratio of a channel width and a channel height). Thus, in forming plural channels with a width of several micrometers to several hundred micrometers, in general, the channels are formed by etching silicon or applying wire electric discharge machining to metal.

JP-A-2004-295718 discloses a heat exchanger in which channels are formed by arranging pipes.

However, it is disadvantageous to form channels using silicon in terms of thermal conductivity compared with a case in which channels are formed using metal such as copper. Thus, it is difficult to use the microchannel structure as the heat exchange component having high cooling performance.

On the other hand, in forming channels with a width of several micrometers to several hundred micrometers using metal such as copper, it is possible to form the channels by using machining such as the wire electric discharge machining. However, long machining time is required to form channels according to the wire electric discharge machining. Thus, the wire electric discharge machining is not preferable as machining for manufacturing a large quantity of microchannel structures at low cost.

It is possible to easily form channels by arranging pipes as disclosed in JP-A-2004-295718. However, when a channel width is several micrometers to several hundred micrometers as in the microchannel structure, since a flow rate of fluid flowing through the pipes is extremely low, heat exchange efficiency significantly falls.

SUMMARY

An advantage of some aspects of the invention is to provide a microchannel structure that -can be manufactured in a short time and at low cost and has high heat exchange efficiency and a manufacturing method therefor.

A microchannel structure according to a first aspect of the invention is a microchannel structure that has plural microchannels through which fluid flows. The microchannels include: a housing section formed in a block; and a pipe array arranged in the housing section and formed by stacking plural pipes.

According to the microchannel structure in the first aspect of the invention having such a characteristic, the microchannels include a pipe array formed by stacking plural pipes. Since fluid flows to all the pipes, a heat transfer effect in a pipe stacking direction is improved. Thus, the microchannel structure according to the first aspect of the invention is a heat exchange component having high heat exchange efficiency.

It is possible to form the microchannels simply by arranging the pipe array in the housing section. Thus, it is possible to form the microchannels in a short time and at low cost compared with a case in which microchannels are formed according to the wire electric discharge machining or the like.

Therefore, the microchannel structure according to the first aspect of the invention can be manufactured in a short time and at low cost and has high heat exchange efficiency.

It is preferable that a sectional shape of the housing section orthogonal to a flowing direction of the fluid is gradually narrowed toward the bottom of the microchannels.

A heat quantity from a heating source radially diffuses. Therefore, by adopting such a constitution, it is possible to obtain high heat exchange efficiency without arranging the pipes in a portion less contributing to heat exchange. This makes it possible to reduce the number of arranged pipes without deteriorating heat exchange efficiency and realize a microchannel structure that can be manufactured at lower cost.

It is preferable that a part of the surface of the pipe array is formed as a mounting area for a solid light-emitting light source that generates heat and emits light.

By adopting such a constitution, it is possible to arrange the solid light-emitting light source directly on the surface of the pipe array. This makes it possible to more efficiently cool the solid light-emitting light source.

It is preferable that the mounting area for the pipe array is planarized.

Consequently, a contact area between the pipe array and the solid light-emitting light source increases. This makes it possible to more efficiently cool the solid light-emitting light source.

It is preferable that the microchannel structure includes a fixing section in which an opening corresponding to the mounting area is formed and that is fixed to the block to fix the pipe array.

By adopting such a constitution, it is possible to easily fix the pipe array while securing an area for directly mounting the solid light-emitting light source on the pipe array.

It is preferable that the microchannel structure includes a mounting plate, one surface side of which is formed as a mounting area for a solid light-emitting light source that generates heat and emits light and the other surface side of which is made capable of coming into close contact with the pipe array.

By adopting such a constitution, it is possible to improve heat transfer efficiency between the solid light-emitting light source and the pipe array. This makes it possible to more efficiently cool the solid light-emitting light source.

It is preferable that the plural pipes are in surface contact with one another.

By adopting such a constitution, a contact area among the pipes increases and heat transfer efficiency is improved. Thus, heat exchange efficiency is further improved.

Specifically, a sectional shape of the pipes is a polygonal shape. This makes it possible to bring the plural pipes into surface contact with one another.

It is preferable that a sealing material having thermal conductivity higher than thermal conductivity of the fluid is filled among the pipes.

By adopting such a constitution, it is possible to seal spaces among the pipes without deteriorating heat transfer efficiency.

It is preferable that thin pipes having a diameter smaller than that of the pipes or bar members having a diameter smaller than that of the pipes are set among the pipes.

By adopting such a constitution, it is possible to reduce a capacity of air layers among the pipes. This makes it possible to improve heat transfer efficiency.

It is preferable that the fluid is fed to the inside of the pipes and spaces among the pipes.

By adopting such a constitution, a contact area between the fluid and the pipes increases. This makes it possible to improve heat transfer efficiency.

It is preferable that, when such a constitution is adopted, plural through-holes are formed in the pipes. By adopting such a constitution, the fluid moves inside and outside the pipes via the through-holes to bring the flow of the fluid into a turbulent state. This makes it possible to further improve heat transfer efficiency.

It is preferable that the through-holes are formed in the pipes other than the pipes that are exposed when the pipes are arranged in the housing section. This makes it possible to prevent the fluid from leading to the outside of the housing section.

A light source device according to a second aspect of the invention is a light source device including: a solid light-emitting light source that emits light and generates heat when an electric current is supplied thereto; and a base on which the solid light-emitting light source is mounted. The microchannel structure according to the first aspect of the invention is used as the base.

The microchannel structure according to the first aspect of the invention can be manufactured in a short time and at low cost and has high heat exchange efficiency. Therefore, the light source device including the microchannel structure as the base can be manufactured at low cost and have an excellent light emission characteristic.

A projector according to a third aspect of the invention includes the light source device according to the second aspect of the invention.

The light source device according to the second aspect of the invention can be manufactured at low cost and has an excellent light emission characteristic. Therefore, the projector including the light source device is inexpensive and shows an excellent display characteristic.

A manufacturing method for a microchannel structure according to a fourth aspect of the invention is a manufacturing method for a microchannel structure that has plural microchannels through which fluid flows. The manufacturing method includes forming the microchannels by stacking to arrange plural pipes in a housing section formed in a block.

According to the manufacturing method for a microchannel structure in the fourth aspect of the invention having such a characteristic, microchannels are formed by stacking to arrange plural pipes in the housing formed in the block. This makes it possible to form microchannels in a short time and at low cost compared with a case in which microchannels are formed according to the wire electric discharge machining or the like. Since the pipes are stacked to be arranged, it is possible to manufacture a microchannel structure in which a flow rate of fluid is sufficiently secured.

Therefore, according to the manufacturing method for a microchannel structure, it is possible to manufacture a microchannel structure that is inexpensive and has high heat exchange efficiency.

It is preferable that a sectional shape of the housing section orthogonal to a flowing direction of the fluid is gradually narrowed toward the bottom of the microchannels.

By adopting such a constitution, the pipes are arranged easily. For example, when the sectional shape of the housing section orthogonal to a flowing direction of fluid is a triangular shape gradually narrowing toward the bottom of the microchannels, it is possible to easily position all the pipes by arranging the pipes in the housing section one after another from above.

It is preferable that plural sub-blocks formed by plural pipes are arranged in the housing section.

By adopting such a constitution, it is possible to form the plural pipes in advance in a fixed state by a unit of sub-block. This makes it possible to easily arrange the pipes.

It is preferable that the single microchannel structure is manufactured by stacking to arrange the plural pipes in a housing section of a composite block, in which blocks of plural microchannel structures are integrally formed, and, then, cutting the composite block.

By adopting such a constitution, it is possible to simultaneously manufacture plural microchannel structures. This makes it possible to manufacture plural microchannel structures in a shorter time.

It is preferable that the manufacturing method for a microchannel structure includes planarizing at least a part of a surface of a pipe array formed by the plural pipes.

By adopting such a constitution, at least the surface of the pipe array is planarized. Therefore, by arranging a solid light-emitting light source in the planarized portion, a contact area between the pipe array and the solid light-emitting light source is increased. This makes it possible to more efficiently cool the solid light-emitting light source. In other words, by adopting such a constitution, it is possible to manufacture a microchannel structure excellent in cooling performance.

It is preferable that the manufacturing method for a microchannel structure includes compressing the entire pipe array formed by the plural pipes.

By adopting such a constitution, at least the surface of the pipe array is planarized and the respective pipes are compressed. This makes it possible to increase a contact area among the pipes. In other words, by adopting such a constitution, it is possible to manufacture a microchannel structure more excellent in cooling performance.

It is preferable that the manufacturing method for a microchannel constitution includes plastically deforming the pipes by feeding high-pressure fluid to the pipe array formed by the plural pipes to improve adhesion among the pipes.

By adopting such a constitution, adhesion among the pipes is improved. This makes it possible to increase a contact area among the pipes. In other words, by adopting such a constitution, it is possible to manufacture a microchannel structure more excellent in cooling performance.

It is preferable that the manufacturing method for a microchannel structure includes: deforming a large-diameter pipe, which collectively wraps the plural pipes in a state in which an extending direction of the plural pipes is opened, according a shape of the housing section; and stacking to arrange the plural pipes in the housing section by arranging the large-diameter pipe after the deforming step in the housing section.

By adopting such a constitution, it is possible to form a pipe array fitting the shape of the housing section simply by deforming the large-diameter pipe. This makes it possible to simplify a manufacturing process for a microchannel structure.

It is preferable that a pipe for feeding and discharging the fluid is connected to an end of the large-diameter pipe. Usually, the pipe for feeding and discharging the fluid is connected to microchannels in a separate step. However, by adopting such a constitution, it is possible to connect the pipe for feeding and discharging the fluid without performing the separate step.

BRIEF DESCRIPTION OF THE DRAWINGS

The invention will be described with reference to the accompanying drawings, wherein like numbers reference like elements.

FIG. 13 is a diagram for explaining a manufacturing method for a microchannel structure in a third embodiment of the invention.

FIG. 22 is a diagram showing a schematic constitution of a projector in an eighth embodiment of the invention.

DESCRIPTION OF EXEMPLARY EMBODIMENTS

Figure 1:
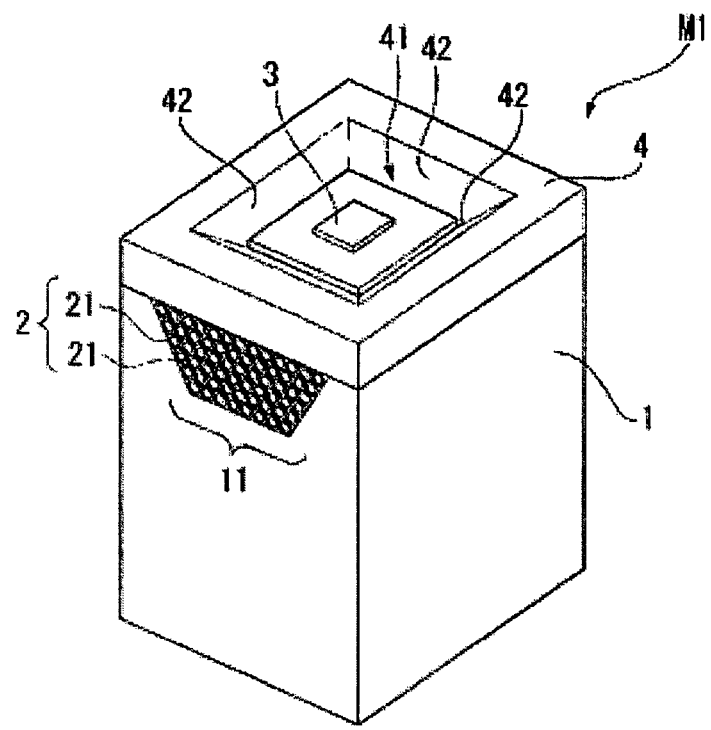
FIG. 1 is a perspective view of a microchannel structure in a first embodiment of the invention.

Exemplary embodiments of the invention will be hereinafter explained with reference to the accompanying drawings. In the drawings, dimensions of respective members are appropriately changed to make it possible to easily recognize the respective members.

First Embodiment

FIG. 1 is a perspective view showing a schematic structure of a microchannel structure in a first embodiment of the invention. As shown in the figure, a microchannel structure M1 in this embodiment includes a block 1 in which a groove 11 serving as a housing section is formed and a pipe array 2 arranged in the groove 11. Microchannels are formed by the groove 11 and the pipe array 2.

Figure 2:
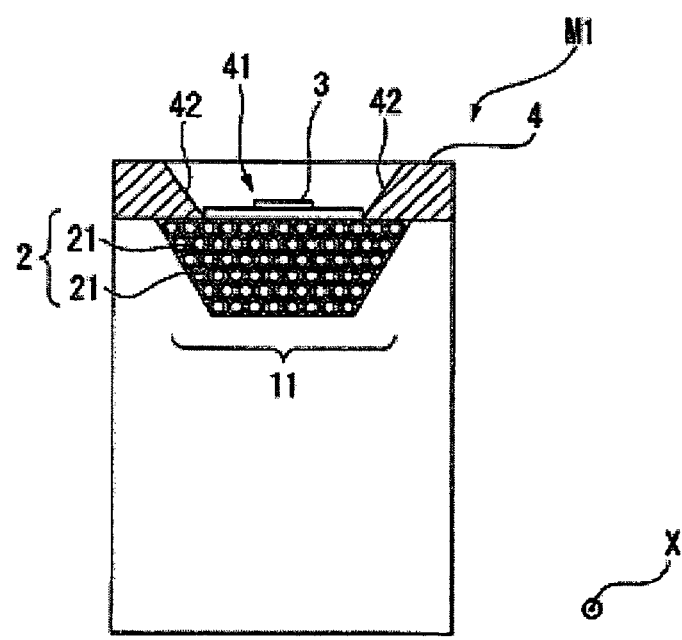
FIG. 2 is a sectional view of the microchannel structure in the first embodiment of the invention.

FIG. 2 is a sectional view of the microchannel structure in this embodiment. As shown in the figure, a sectional shape of the groove 11 is a reverse trapezoidal shape. In the microchannel structure M1 in this embodiment, a vertical direction in FIG. 2 is set as a flowing direction X of fluid. In other words, in the microchannel structure M1 in this embodiment, a sectional shape orthogonal to the flowing direction X of the fluid in the groove 11 (the housing section) is a reverse trapezoidal shape gradually narrowing toward the bottom of the microchannels (the lower side in FIG. 2).

Figure 3:
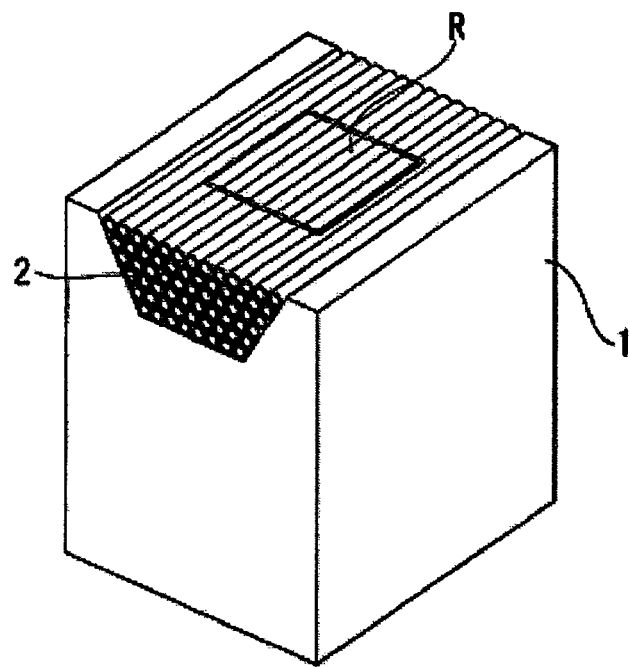
FIG. 3 is a diagram for explaining the microchannel structure in the first embodiment of the invention.

As shown in FIGS. 1 and 2, the pipe array 2 is housed and arranged in the groove 11. The pipe array 2 is formed by stacking plural pipes 21 arranged to extend in the flowing direction of the fluid. As shown in FIG. 3, a part of the upper surface (the surface) of the pipe array 2 is planarized. The planarized portion is formed as a mounting area R for a LED chip 3 (a solid light-emitting light source: see FIG. 1).

Referring back to FIGS. 1 and 2, an opening 41 corresponding to the mounting area R of the pipe array 2 is formed in the microchannel structure M1 in the first embodiment. The microchannel structure M1 includes a top plate 4 (a fixing section) that is fixed to the block 1 to fix the pipe array 2. A sidewall 42 of the opening 41 of the top plate 4 is slanted from the outer side to the inner side of the opening. The surface of the sidewall 42 is formed as a reflection surface for efficiently leading light emitted from the LED chip 3 in a necessary direction. The reflection surface may be a plane. More desirably, the reflection surface is an aspherical surface that can more efficiently lead the emitted light in the necessary direction.

Figure 4:
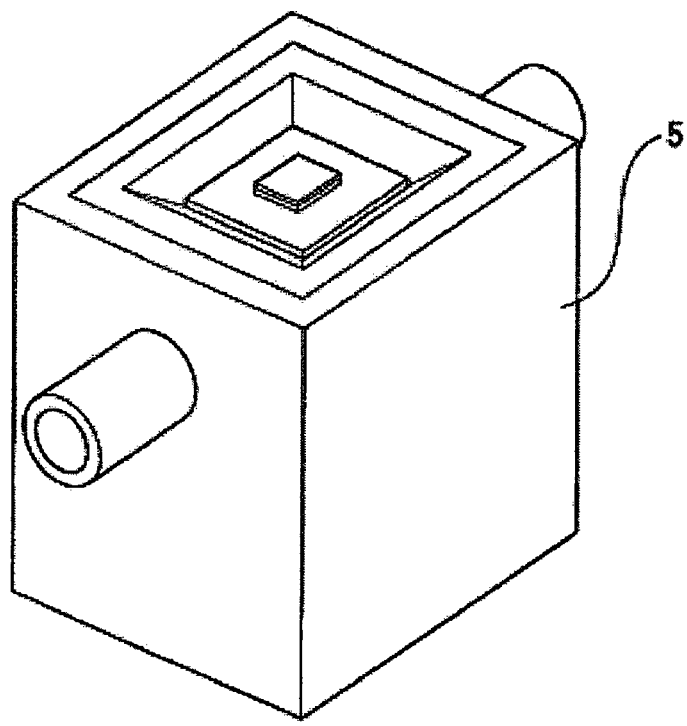
FIG. 4 is a diagram showing a state in which the microchannel structure in the first embodiment of the invention is housed in a housing.
Figure 5:
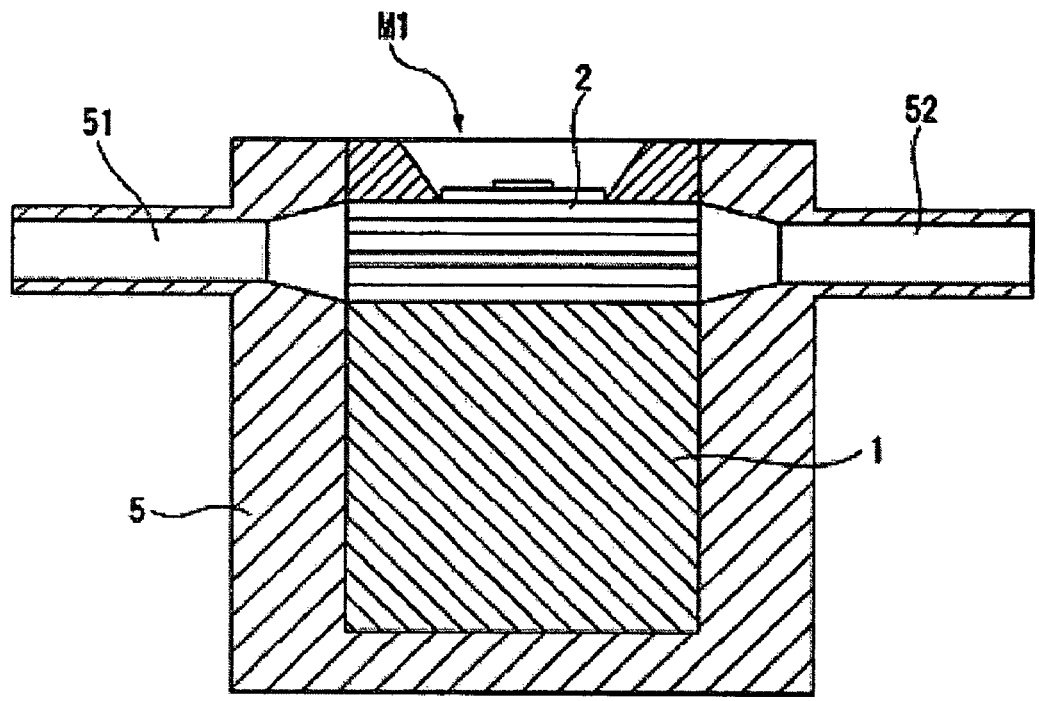
FIG. 5 is a sectional view of the state in which the microchannel structure in the first embodiment of the invention is housed in the housing.

As shown in FIGS. 1 and 2, in the microchannel structure M1 in this embodiment, the LED chip 3 is arranged in the mounting area R of the pipe array 2. The microchannel structure M1, in which the LED chip 3 is arranged in the mounting area R of the pipe array 2 in this way, is finally housed inside the housing 5 as shown in FIG. 4. FIG. 5 is a sectional view of the microchannel structure M1 in this embodiment housed in the housing 5. As shown in FIG. 5, in the housing 5, a supply port 51 for supplying the fluid to the microchannel structure M1 and a discharge port 52 for discharging the fluid from the microchannel structure M1 are integrally formed. The supply port 51 is arranged in contact with one end of the pipe array 2 and the discharge port 52 is arranged in contact with the other end of the pipe array 2.

According to the microchannel structure M1 in this embodiment having such a constitution, plural microchannels through which the fluid is fed are formed by the groove 11 of the block 1 and the pipe array 2 arranged in the groove 11. Therefore, it is possible to form the microchannels simply by arranging the pipe array 2 in the groove 11. This makes it possible to form the microchannels in a short time and at low cost compared with a case in which the microchannels are formed according to the wire electric discharge machining or the like. The pipe array 2 is formed by stacking the plural pipes 2. Therefore, since the fluid flows to the entire pipes 2, a heat transfer effect in a stacking direction of the pipes is improved. This makes it possible to use the microchannel structure M1 in this embodiment as a heat exchange component having high heat exchange efficiency.

According to the microchannel structure M1 in this embodiment, the sectional shape of the groove 11 orthogonal to the flowing direction X of the fluid is a reverse trapezoidal shape gradually narrowing toward the bottom of the microchannels. A heat quantity from the LED chip 3 radially diffuses. Therefore, by adopting such a constitution, it is possible to obtain high heat exchange efficiency without arranging the pipes 21 in a portion less contributing to heat exchange. This makes it possible to reduce the number of arranged pipes 21 without deteriorating heat exchange efficiency and realize a microchannel structure that can be manufactured at lower cost.

According to the microchannel structure M1 in this embodiment, a part of the upper surface of the pipe array 2 is planarized and the planarized portion is formed as the mounting area R for the LED chip 3. Therefore, since it is possible to arrange the LED chip 3 directly on the surface of the pipe array 2, it is possible to more efficiently cool the LED chip 3. Since the mounting area R of the pipe array 2 is planarized, a contact area between the pipe array 2 and the LED chip 3 increases. This makes it possible to more efficiently cool the LED chip 3.

In the microchannel structure M1 in this embodiment, it is preferable that the pipes 2 forming the pipe array 2 are in surface contact with one another. Consequently, since a contact area among the pipes 21 increases and heat transfer efficiency is improved, heat exchange efficiency is further improved.

A manufacturing method for the microchannel structure M1 in this embodiment formed as described above will be explained.

Figure 6:
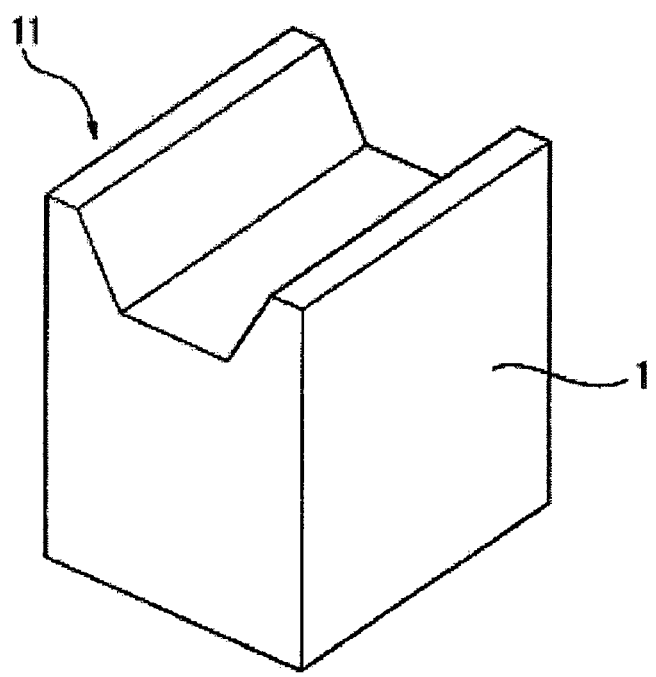
FIG. 6 is a diagram for explaining a manufacturing method for the microchannel structure in the first embodiment of the invention.

As shown in FIG. 6, the block 1 formed with the groove 11 is prepared. It is possible to easily form the groove 11 by applying cutoff such as dicing to the block 1. In this embodiment, as described above, the groove 11 is formed to have the reverse trapezoidal sectional shape.

Figure 7:
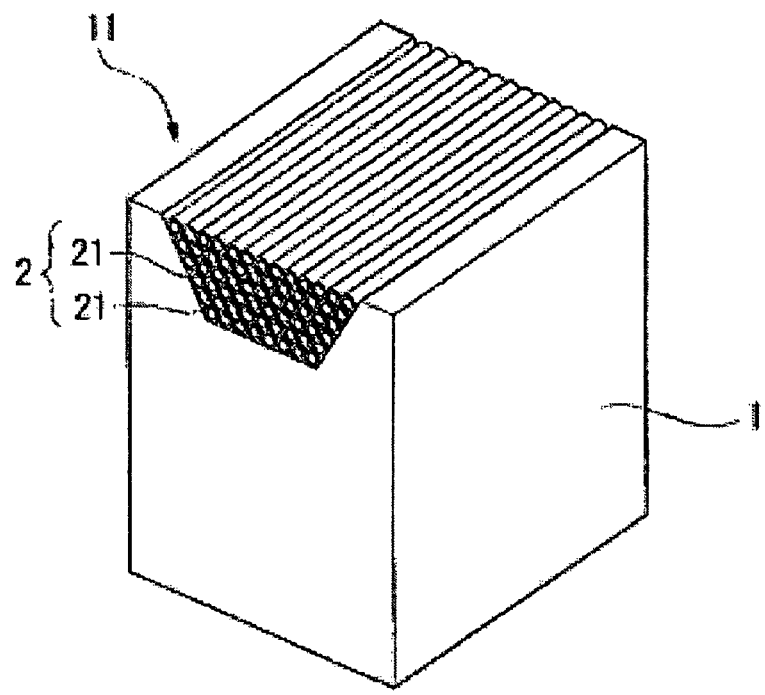
FIG. 7 is a diagram for explaining the manufacturing method for the microchannel structure in the first embodiment of the invention.
Figure 8:
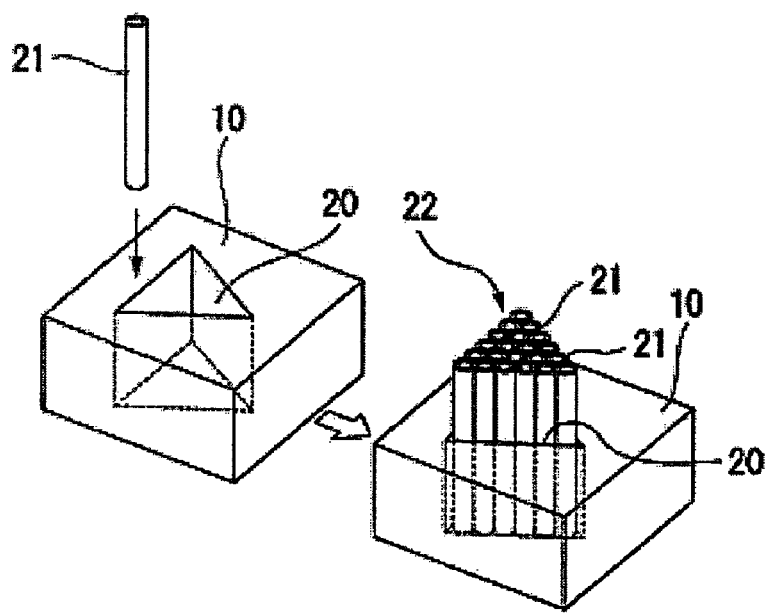
FIG. 8 is a diagram for explaining the manufacturing method for the microchannel structure in the first embodiment of the invention.

Subsequently, as shown in FIG. 7, the pipe array 2 is arranged and formed by stacking to arrange the plural pipes 21 in the groove 11. The microchannels including the groove 11 and the pipe array 2 is formed in this step. Specifically, it is possible to form a sub-block 22 (in this embodiment, a sub-block that has a triangular shape in a plan view as shown in FIG. 8) formed by bundling up the plural pipes 21 and form the pipe array 2 by arranging plural sub-blocks 22 in the groove 11. Since the sub-block 22 is formed in this way and the plural sub-blocks 22 are combined to form the pipe array 2, it is possible to easily form the pipe array 2 compared with a case in which the separate pipes 21 are arranged in the groove 11.

In forming the sub-block 22, for example, an external shape forming die 10 shown in FIG. 8 is used. The external shape forming die 10 assumes a square plate shape and an external shape forming hole 20 (a through-hole) of a triangular shape (a regular triangular shape) is provided in the center of the external shape forming die 10.

As shown in FIG. 8, the external shape forming die 10 is mounted on a flat table or the like to close a lower end opening of the external shape forming hole 20. The plural pipes 21 are vertically filled in the external shape forming hole 20 from above in this state. Consequently, the pipes 21 are arranged in a honeycomb shape in a state in which outer surfaces of the adjacent pipes 21 are in contact with each other. An external shape of the entire pipes 21 in a plan view becomes a triangular shape.

Figure 9:
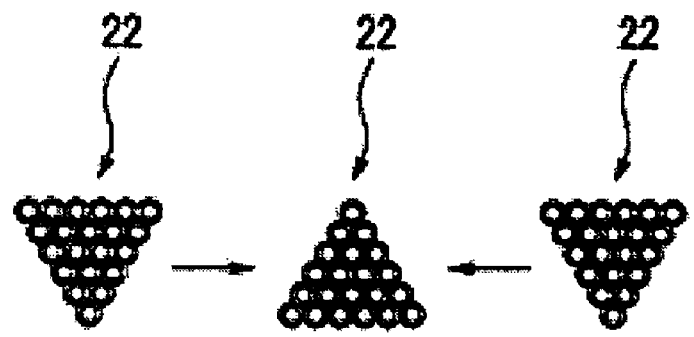
FIG. 9 is a diagram for explaining the manufacturing method for the microchannel structure in the first embodiment of the invention.

It is possible to form the pipe array 2 by joining the three sub-blocks 22 as shown in FIG. 9.

Figure 10:
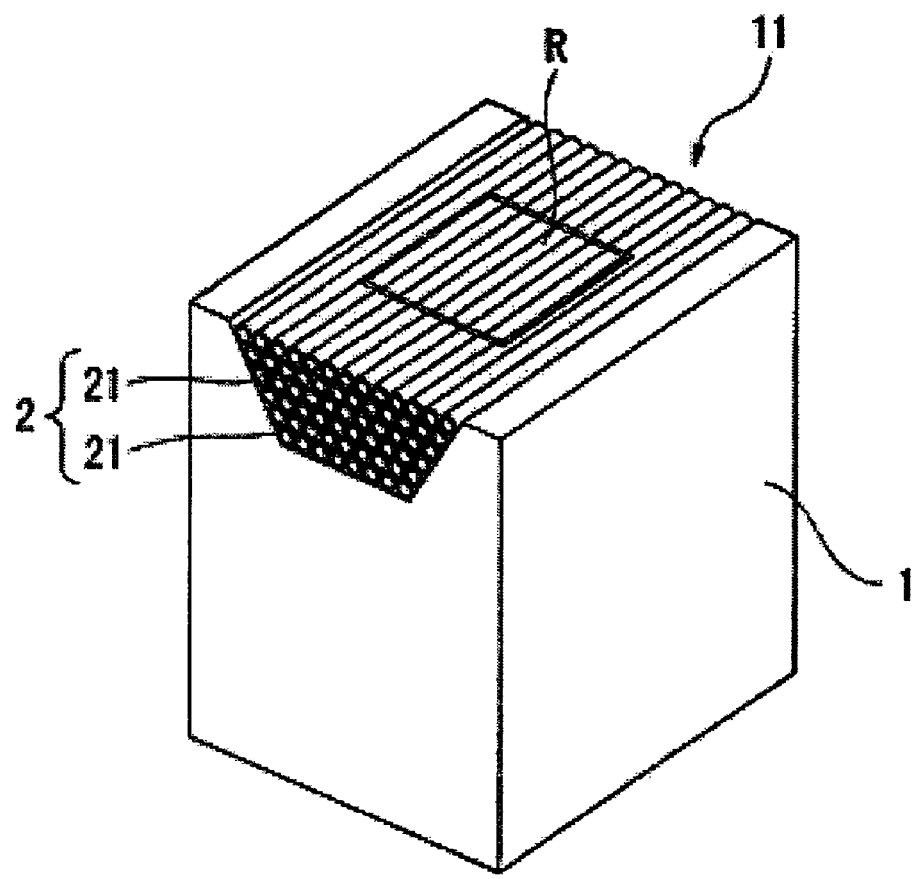
FIG. 10 is a diagram for explaining the manufacturing method for the microchannel structure in the first embodiment of the invention.

After the pipe array 2 is arranged in the groove 11 in this way, as shown in FIG. 10, a part of the upper surface (the surface) of the pipe array 2 is planarized. Specifically, a part of the upper surface of the pipe array 2 is planarized by pressing the part using a press working machine or the like. Consequently, the mounting area R is formed in the upper surface of the pipe array 2.

Subsequently, the pipe array 2 is fixed by fixing the top plate 4, in which the opening 41 corresponding to the mounting area R is formed, to the block 1 to cover the pipe array 2. Since the opening 41 corresponding to the mounting area R is formed in the top plate 4, even if the top plate 4 is fixed to the block 1, the mounting area R of the pipe array 2 is in an exposed state. The microchannel structure M1 shown in FIGS. 1 and 2 is manufactured by arranging the LED chip 3 in the mounting area R of the pipe array 2.

According to the manufacturing method for a microchannel structure in this embodiment, the microchannels are formed by arranging the plural sub-blocks 22 in the groove 11 or stacking to arrange the plural pipes 21 in the groove 11. Therefore, it is possible to form the microchannels in a short time and at low cost compared with the case in which the microchannels are formed according to the wire electric discharge machining or the like. Since the pipes 21 are stacked to be arranged, it is possible to sufficiently secure a flow rate of the fluid flowing to the microchannels. This makes it possible to efficiently cool the LED chip 3.

Therefore, a microchannel structure manufactured by the manufacturing method for a microchannel structure in this embodiment can be manufactured in a short time and at low cost and has high heat exchange efficiency.

According to the manufacturing method for a microchannel structure in this embodiment, the sectional shape of the groove 11 is a reverse trapezoidal shape gradually narrowing toward the bottom of the microchannels. Thus, it is easy to position the pipe array 2, that is, the sub-blocks 22, compared with a case in which the sectional shape of the groove 11 is a rectangular shape.

According to the manufacturing method for a microchannel structure in this embodiment, the sub-block 22 including the plural pipes 21 is formed in advance and the pipe array 2 is formed by arranging the plural sub-blocks 22 in the groove 11. This makes it possible to easily arrange all the pipes 21 in the groove 11 compared with a case in which the separate pipes 21 are arranged in the groove 11 one by one.

In the manufacturing method for a microchannel structure in this embodiment, a part of the upper surface of the pipe array 2 is formed as the mounting area R. The mounting area R is planarized by the press working machine or the like to be formed. Therefore, a contact area between the microchannel structure M1 in this embodiment and the LED chip 3 increases to more efficiently cool the LED chip 3. In other words, according to the manufacturing method for a microchannel structure in this embodiment, it is possible to manufacture a microchannel structure having high cooling performance.

It is possible to obtain a form shown in FIG. 4 by housing the microchannel structure M1 manufactured as described above inside the housing 5.

As it is seen from the above explanation, in this embodiment, the microchannel structure M1 is formed by the block 1, the pipe array 2, and the top plate 4. The LED chip 3 is not a component of the microchannel structure M1. In the microchannel structure and the manufacturing method therefor in this embodiment, it is explained that the LED chip 3 is arranged in the microchannel structure M1. However, the invention is not limited to this. It is possible to arrange a heat generation source, which requires cooling, in the mounting area R.

In bringing the pipes 21 into surface contact with one another, for example, it is possible to bring the pipes 21 into surface contact with one another by, for example, performing the step of pressing the entire pipe array 2 arranged in the groove 11 with the press working machine or the like. It is also possible to bring the pipes 21 into surface contact with one another by using pipes having a polygonal sectional shape instead of the pipes 21.

It is also possible to, for example, plastically deform the respective pipes 21 of the pipe array 2 by feeding high-pressure fluid to the pipes 21 to thereby bring the pipes 21 into surface contact with one another.

Second Embodiment

A second embodiment of the invention will be explained. In the explanation of the second embodiment, explanations of components same as those in the first embodiment are omitted or simplified.

Figure 11:
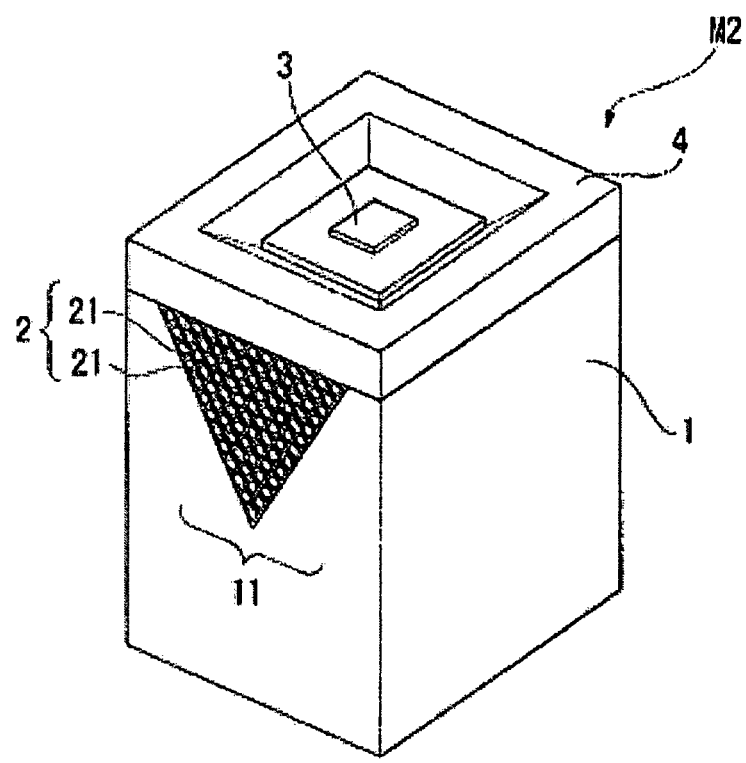
FIG. 11 is a perspective view of a microchannel structure in a second embodiment of the invention.

FIG. 11 is a perspective view of a microchannel structure M2 in the second embodiment. As shown in the figure, in the microchannel structure M2 in this embodiment, a sectional shape of the groove 11 is a reverse triangular shape.

In the microchannel structure M2 in this embodiment having such a constitution, the pipe array 2 formed by stacking plural pipes 21 is arrange in the groove 11 in the same manner as the microchannel structure M1 in the first embodiment. Thus, since fluid flows to the entire pipes 21, a heat transfer effect in a stacking direction of the pipes is improved. This makes it possible to use the microchannel structure M2 in this embodiment as a heat exchange component having high heat exchange efficiency in the same manner as the microchannel structure M1 in the first embodiment.

Figure 12:
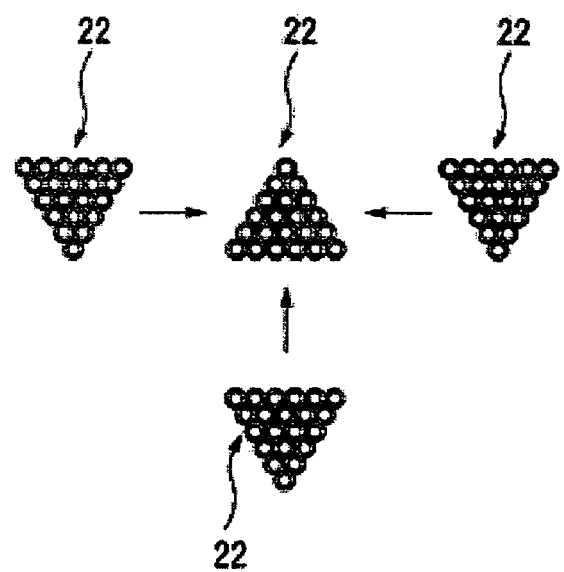
FIG. 12 is a diagram for explaining a manufacturing method for the microchannel structure in the second embodiment of the invention.

Since a sectional shape of the pipe array 2 in this embodiment is a reverse triangular shape, for example, the pipe array 2 is formed by joining four sub-blocks 22 as shown in FIG. 12.

Third Embodiment

A third embodiment of the invention will be explained. In the explanation of the third embodiment, explanations of components same as those in the first embodiment are omitted or simplified as in the second embodiment.

As shown in FIG. 13, a manufacturing method for a microchannel structure in this embodiment is a method of manufacturing a large quantity of single microchannel structures M1 at a time by arranging the pipe array 2 in a groove 40 of a composite block 30, in which blocks 1 for plural microchannel structures are integrally formed, and, then, cutting the composite block 30.

According to such a manufacturing method for a microchannel structure in this embodiment, it is possible to simultaneously manufacture plural microchannel structures. This makes it possible to manufacture plural microchannel structures M1 in a shorter time.

Fourth Embodiment

A fourth embodiment of the invention will be explained. In the explanation of this embodiment, explanations of components same as those in the first embodiment are omitted or simplified as in the second and the third embodiments.

Figure 14:
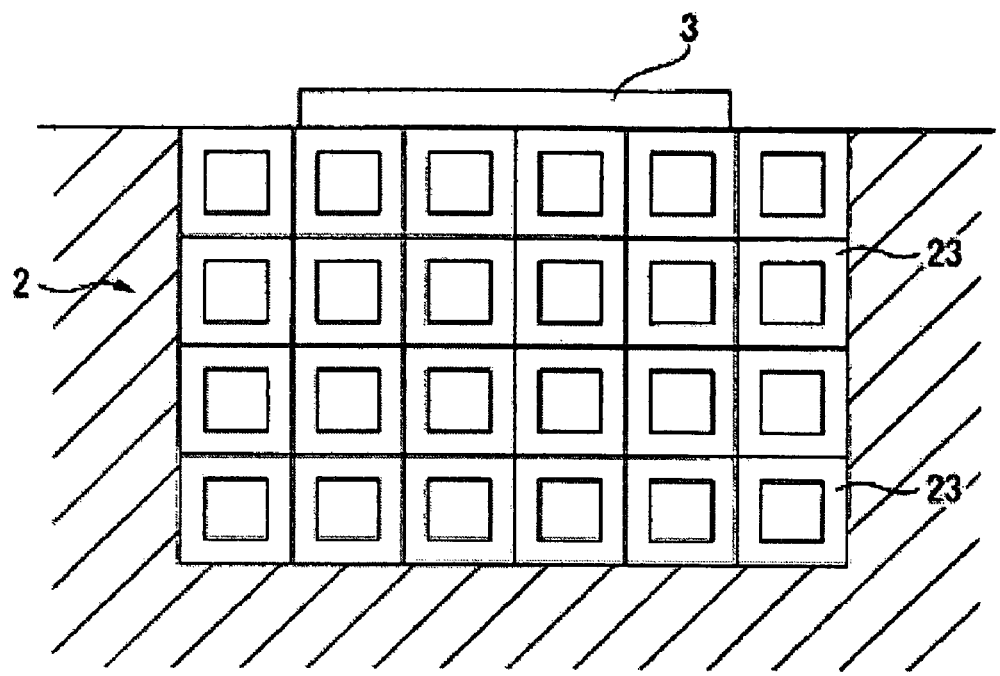
FIG. 14 is a schematic diagram showing a section of a microchannel structure in a fourth embodiment of the invention.

FIG. 14 is a schematic diagram showing a section of a microchannel structure in this embodiment. As shown in the figure, in the microchannel structure in this embodiment, pipes 23 having a rectangular sectional shape are used instead of the pipes 21 having a circular sectional shape used in the first embodiment.

According to such a microchannel structure in this embodiment, since the sectional shape of the pipes 23 is a rectangular shape, it is possible to surely bring the respective pipes 23 into surface contact with one another. Therefore, since a contact area among the pipes increases and heat transfer efficiency is improved, heat exchange efficiency between fluid and the LED chip 3 is improved.

Figure 15:
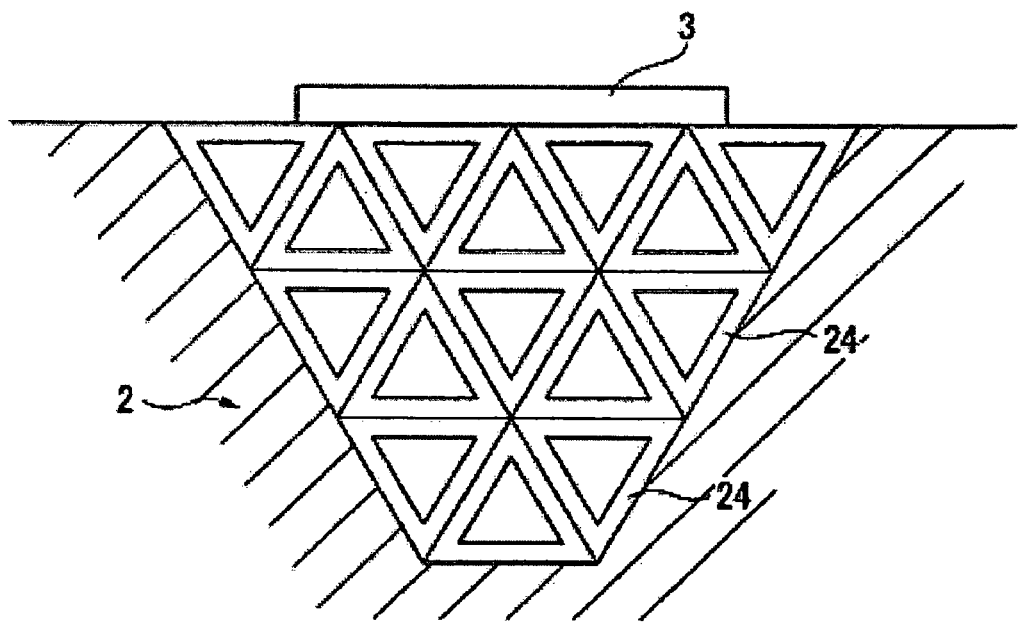
FIG. 15 is a schematic diagram showing a modification of the microchannel structure in the fourth embodiment of the invention.

A sectional shape of pipes only has to be a polygonal shape and does not have to be a rectangular shape. For example, as shown in FIG. 15, it is also possible to use pipes 24 having a triangular sectional shape.

Fifth Embodiment

A fifth embodiment of the invention will be explained. In the explanation of this embodiment, explanations of components same as those in the first embodiment are omitted or simplified as in the second to the fourth embodiments.

Figure 16:
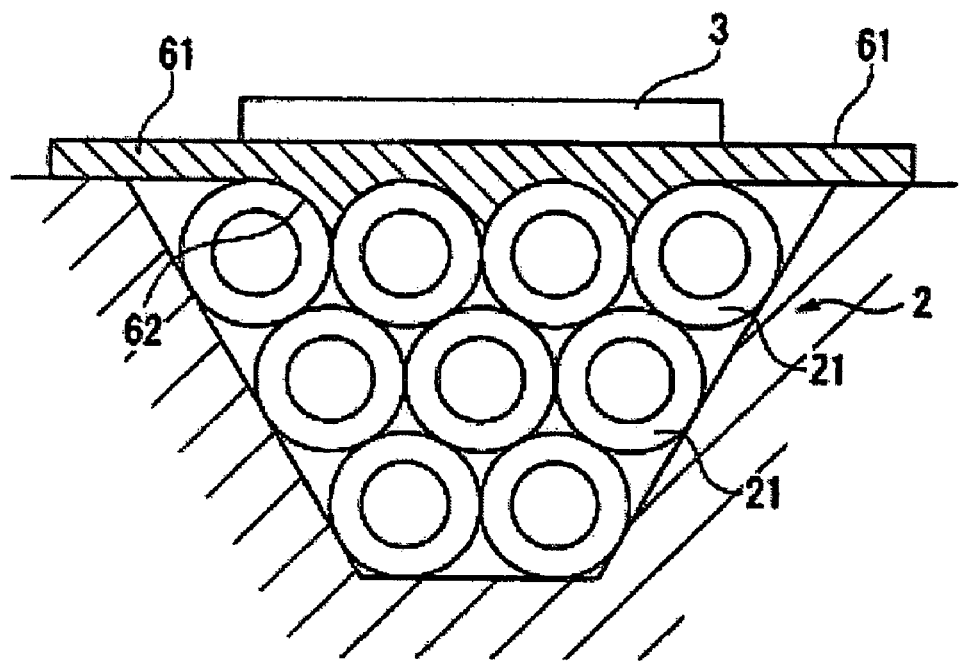
FIG. 16 is a schematic diagram showing a section of a microchannel structure in a fifth embodiment of the invention.

FIG. 16 is a schematic diagram showing a section of a microchannel structure in this embodiment. As shown in the figure, the microchannel structure in this embodiment includes a mounting plate 60, one surface side 61 of which is formed as a mounting area R for the LED chip 3 and the other surface side 62 of which is made capable of coming into close contact with the pipe array 2.

Specifically, in the mounting plate 60, the one surface side 61 is flat and the other surface side 62 is formed in a shape corresponding to unevenness of the surface of the pipe array 2.

In such a microchannel structure in this embodiment, since it is possible to fill a space between the pipe array 2 and the LED chip 3 with the mounting plate 60, it is possible to improve heat transfer efficiency between the pipe array 2 and the LED chip 3 as in the embodiments described above. Therefore, it is possible to more efficiently cool the LED chip 3.

In the microchannel structure in this embodiment, a sectional shape of pipes does not have to be formed in a circular shape as in the embodiments described above and it is also possible to use, for example, pipes having a hexagonal sectional shape.

For example, since it is possible to cover the groove 11 by setting the mounting plate 60, it is possible to feed fluid among the pipes 21 as well.

Since the fluid is fed among the pipes 21 in this way, a contact area between the fluid and the pipes increases to make it possible to improve heat transfer efficiency.

Figure 17:
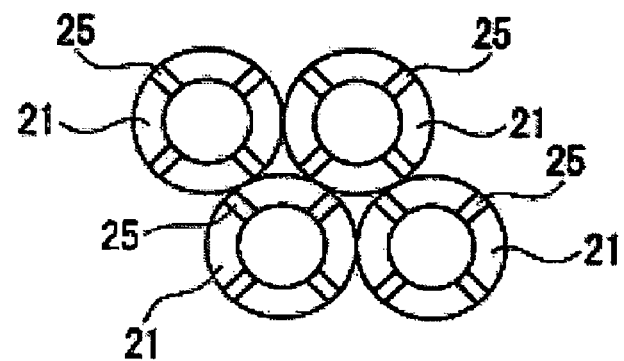
FIG. 17 is a schematic diagram showing a modification of the microchannel structure in the fifth embodiment of the invention.

As shown in FIG. 17, it is preferable that plural through-holes 25 are formed in the pipes 21. By adopting such a constitution, the fluid moves inside and outside the pipes 21 via the through-holes 25 to bring the flow of the fluid into a turbulent state. This makes it possible to further improve heat transfer efficiency.

Note that it is also possible to form the through-holes 25 in the pipes 21 in the microchannel structure in the first embodiment not including the mounting plate 60. However, in that case, in order to prevent the fluid from leaking to the outside of the groove 11, it is preferable that the through-holes 25 are formed in the pipes other than the pipes exposed in the groove 11, that is, the pipes 21 other than those at the uppermost stage in the groove 11.

Sixth Embodiment

A sixth embodiment of the invention will be explained. In the explanation of this embodiment, explanations of components same as those in the first embodiment are omitted or simplified as in the second to the fifth embodiments.

Figure 18:
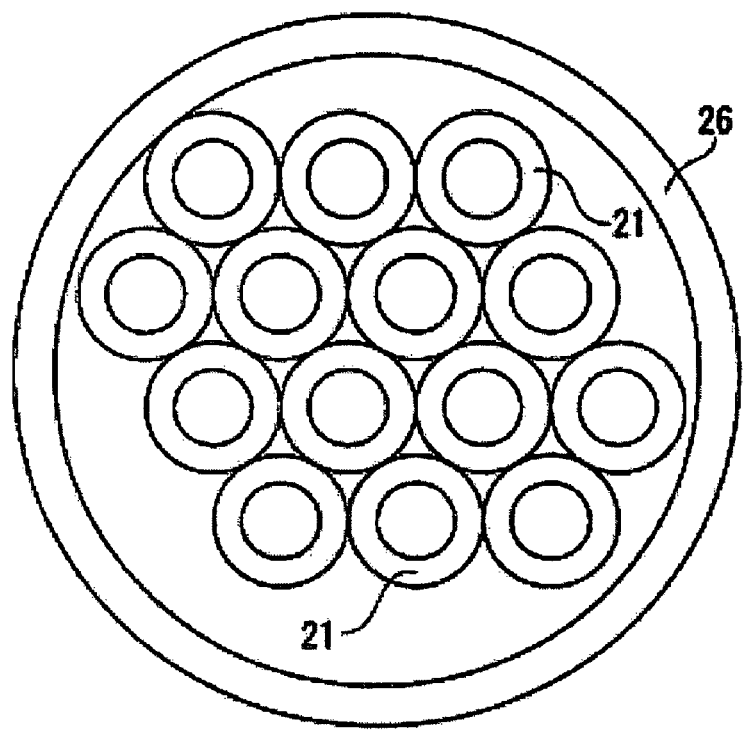
FIG. 18 is a diagram for explaining a manufacturing method for a microchannel structure in a sixth embodiment of the invention.
Figure 19:
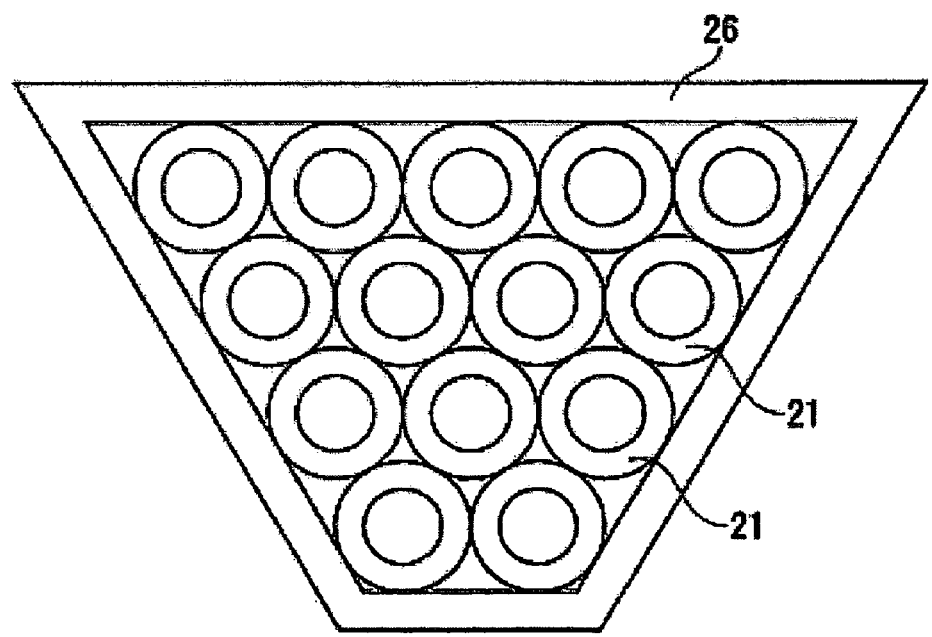
FIG. 19 is a diagram for explaining the manufacturing method for the microchannel structure in the sixth embodiment of the invention.

FIGS. 18 and 19 are diagrams for explaining a manufacturing method for a microchannel structure in this embodiment. As shown in the figure, in the manufacturing method for a microchannel structure in this embodiment, the plural pipes 21 are arranged inside a large-diameter pipe 26. In other words, as shown in FIG. 18, the plural pipes 21 are collectively wrapped by the large-diameter pipe 26 in a state in which an extending direction of the pipes 21 is opened.

Thereafter, as shown in FIG. 19, the large-diameter pipe 26 is deformed according to the shape of the groove 11 (the deforming step). The pipe array 2 is formed by arranging the deformed large-diameter pipe 26 in the groove 11.

According to such a manufacturing method for a microchannel structure in this embodiment, it is possible to form the pipe array 2 fitting the shape of the groove 11 simply by deforming the large-diameter pipe 26. This makes it possible to simplify a manufacturing process of the microchannel structure.

It is preferable that a supply port 51 for supplying the fluid to the microchannel structure M1 and a discharge port 52 for discharging the fluid from the microchannel structure M1 (a pipe for feeding and discharging the fluid) are connected to an end of the large-diameter pipe 26 in advance. In other words, the large-diameter pipe 26 and the supply port 51 and discharge port 52 may be integrally formed. By adopting the constitution in this embodiment, it is unnecessary to connect the supply port 51 and the discharge port 52 to the end of the large-diameter pipe 26 in a separate step and, for example, it is possible to remove the housing 5.

Seventh Embodiment

A light source device having the microchannel structure in any one of the embodiments will be explained as a seventh embodiment of the invention.

In the explanation of this embodiment, a light source device including the microchannel structure M1 in the first embodiment will be explained. However, the microchannel structure is not limited to the microchannel structure M1 in the first embodiment. The light source device may include the microchannel structures in any one of the second to the sixth embodiments.

Figure 20:
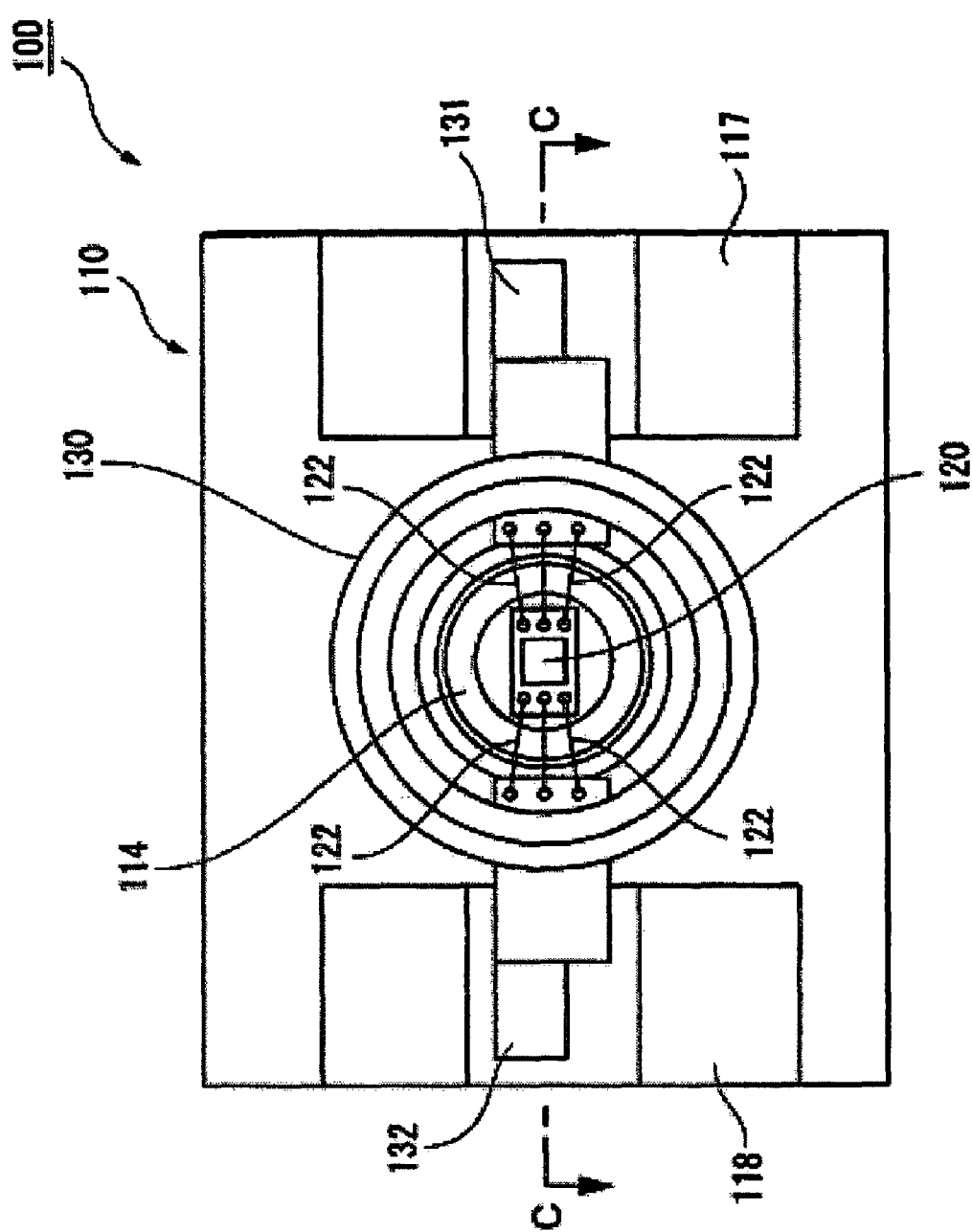
FIG. 20 is a diagram showing a schematic constitution of a light source device in a seventh embodiment of the invention.
Figure 21:
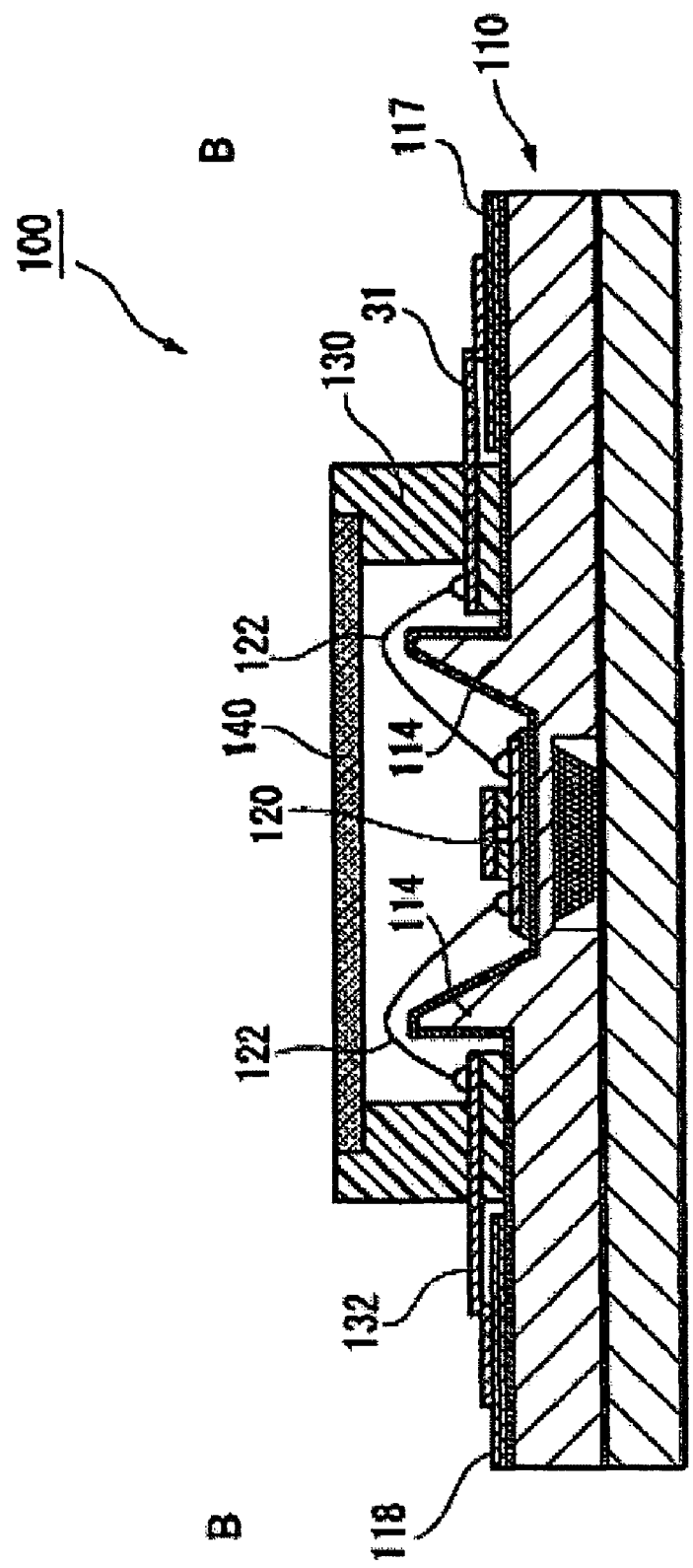
FIG. 21 is a sectional view along line C-C in FIG. 20.

FIG. 20 is a plan view showing a schematic constitution of a light source device 100 in the seventh embodiment. FIG. 21 is a sectional view along line C-C in FIG. 20.

As shown in these figures, the light source device 100 in this embodiment includes a base 110, an LED chip 120 (a solid light-emitting light source), a resin frame 130, and a cap 140.

The base 110 is a base on which the LED chip 120 (the solid light-emitting light source) is mounted. The base 110 is formed by the microchannel structure in any one of the embodiments.

The LED chip 120 is a chip that emits light and generates heat when an electric current is supplied thereto. The LED chip 120 is formed of silicon or the like and flip-chip-mounted on a sub-mount in which wiring for supplying electric power to the LED chip 120 is formed. The LED 120 is mounted on the base 110 together with the sub-mount by a heat conductive adhesive (e.g., silver paste).

A reflector 114 is arranged on the upper surface of the base 110. The resin frame 130 is arranged to surround the reflector 114. The cap 140 is arranged to be supported in the upper part of the resin frame 130. Silicon oil or the like is filled in a space formed by the cap 140 and the resin frame 130. As shown in FIGS. 20 and 21, outer leads 131 and 132 are insert-molded in the resin frame 130. One ends of the outer leads 131 and 132 are connected to flexible boards 117 and 118 arranged on the base 110. The other ends of the outer leads 131 and 132 are connected to connection pads formed on the sub-mount 121 by gold wires 122 or the like. Electric power is supplied to the LED chip 120 via the sub-mount 121, the flexible boards 117 and 118, the outer leads 131 and 132, and the gold wires 122. In this embodiment, as shown in FIG. 20, three gold wires 122 are connected to each of the outer leads 131 and 132. However, the number of the gold wires 122 is changed according to an amount of electric power supplied to the LED chip 120.

In the light source device 100 in this embodiment formed in this way, when an electric current is supplied to the LED chip 120, light is emitted from the LED chip 120 and the light emitted is emitted from the light source device 100 via the cap 140. Light emitted in a lateral direction from the LED chip 120 is reflected in a direction of the cap 140 by the reflector 114 and, then, emitted from the light source device 100 via the cap 140.

In the light source device 100 in this embodiment, since the microchannel structure M1 in any one of the embodiments is used as the base 110, it is possible to efficiently cool the LED chip 120 by feeding a cooling medium (fluid) to the microchannels. This makes it possible to prevent damages to the LED chip 120 due to heat. Therefore, it is possible to obtain the light source device excellent in reliability.

It is possible to manufacture the microchannel structure M1 in the embodiments at low cost and in a large quantity as described above. Thus, it is also possible to manufacture the light source device 100 including the microchannel structure M1 as the base 110 at low cost.

Eighth Embodiment

A projector including the light source device 100 in the seventh embodiment will be explained as an eighth embodiment of the invention.

FIG. 22 is a diagram for explaining a projector 500 including the light source device in the seventh embodiment. In the figure, reference numerals 512, 513, and 514 denote light source devices in the seventh embodiment; 522, 523, and 524, liquid crystal light bulbs; 525, a cross dichroic prism; and 526, a projection lens.

The projector 500 in FIG. 22 includes the three light source devices 512, 513, and 514 formed as described in the seventh embodiment. LED chips that emit light of red (R), green (G), and blur (B) are adopted as the respective light source devices 512, 513, and 514. Rod lenses or fly-eye lenses may be arranged behind the respective light source devices as uniform lighting systems for uniformalizing an illuminance distribution of light source light.

A light beam from the red light source device 512 is transmitted through a superimposing lens 535R and reflected on a reflection mirror 517 to be made incident on the red light liquid crystal light bulb 522. A light beam from the green light source device 513 is transmitted through a superimposing lens 535G to be made incident on the green light liquid crystal light bulb 523. A light beam from the blue light source device 514 is transmitted through a superimposing lens 535B and reflected on a reflection mirror 516 to be made incident on the blue light liquid crystal light bulb 524. When the fly-eye lenses are used as the uniform lighting systems, light beams from the respective light sources are superimposed in display areas of the liquid crystal light bulbs through the superimposing lenses to uniformly light the liquid crystal light bulbs.

Sheet polarizers (not shown) are arranged on an incidence side and an emission side of each of the liquid crystal light bulbs.

Only linear polarized light in a predetermined direction among light beams from each of the light sources is transmitted through the incidence side sheet polarizer to be made incident on each of the liquid crystal light bulbs. Polarized light converting means (not shown) may be provided in front of the incidence side sheet polarizer. In this case, it is possible to recycle a light beam reflected on the incidence side sheet polarizer to be made incident on each of the liquid crystal light bulbs. This makes it possible to improve efficiency of use of light.

Three color lights modulated by the respective liquid crystal light bulbs 522, 523, and 524 are made incident on the cross dichroic prism 525. This prism is formed by sticking four rectangular prisms together. A dielectric multilayer film that reflects red light and a dielectric multilayer film that reflects blue light are arranged in a cross shape inside the prism. The three color lights are combined by these dielectric multilayer films to form light representing a color image. The combined light is projected on a projection screen 527 by a projection lens 526 serving as a projection optical system to display an enlarged image.

The light source device in this embodiment has a high luminance because the LED chips are cooled. Further, it is possible to manufacture the light source device at low cost. Therefore, since the projector includes the light source device, it is possible to provide the projector excellent in a display characteristic at low cost.

The exemplary embodiments of the invention have been explained with reference to the accompanying drawings. It goes without saying that the invention is not limited to the embodiments. The shapes, the combinations, and the like of the components described in the embodiments are only examples. Various alterations thereof are possible on the basis of design requirements and the like within a range not departing from the spirit of the invention.

For example, in the microchannel structure in the first embodiment, the block 1 and the top plate 4 are separately formed. However, the invention is not limited to this. The block 1 and the top plate 4 may be integrally formed. By adopting such a constitution, it is possible to reduce a thermal resistance between the block 1 and the top plate 4 and a sealing property is improved. In such a case, it is possible to form the pipe array 2 by arranging the pipes 21 in the groove 11 from the lateral direction of the groove 11.

Figure 23:
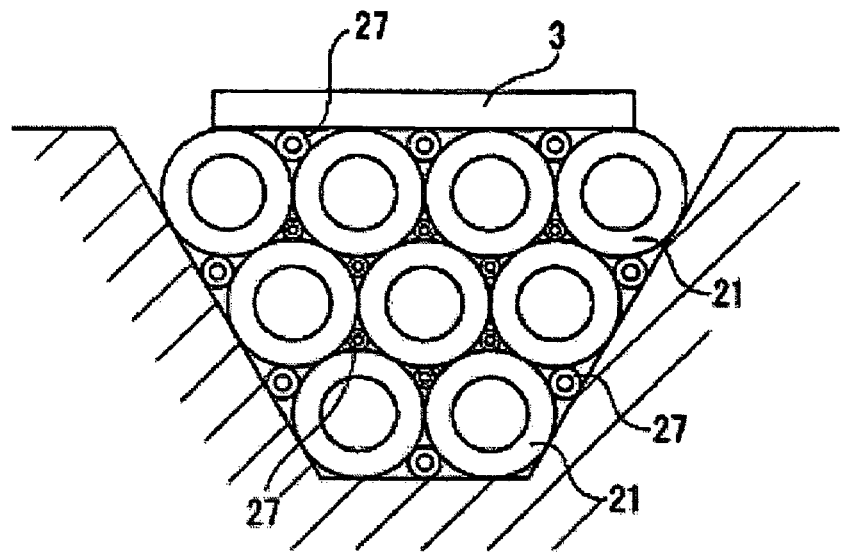
FIG. 23 is a modification of the microchannel structure in any one of the embodiments of the invention.

It is likely that fluid is held up among the pipes 21 and the liquid held up acts as a heat insulator. Therefore, a sealing material may be filled among the pipes 21. It is preferable that that the sealing material is formed of a material having thermal conductivity higher than thermal conductivity of the fluid. By forming the sealing material from the material having thermal conductivity higher than thermal conductivity of the fluid in this way, it is possible to seal the spaces among the pipes 21 without deteriorating thermal conductivity in the microchannel structure as a whole. As shown in FIG. 23, pipes 27 (thin pipes) having a diameter smaller than that of the pipes 21 may be filled among the pipes 21 instead of the sealing material. Bar members may be filled instead of the small-diameter pipes 27.

On the other hand, in actively causing fluids flowing through the respective pipes 21 to interfere with one another (mix with one another), for example, it is preferable that the respective pipes 21 are formed of a porous material. By forming the pipes 21 with the porous material in this way, since the fluids flowing through the pipes 21 flows out to the outside of the pipes 21, that is, the spaces among the pipes 21, it is possible actively cause the fluids to interfere with one another. In such a case, it is also possible to prevent the fluids from being held up among the pipes 21.

Figure 24:
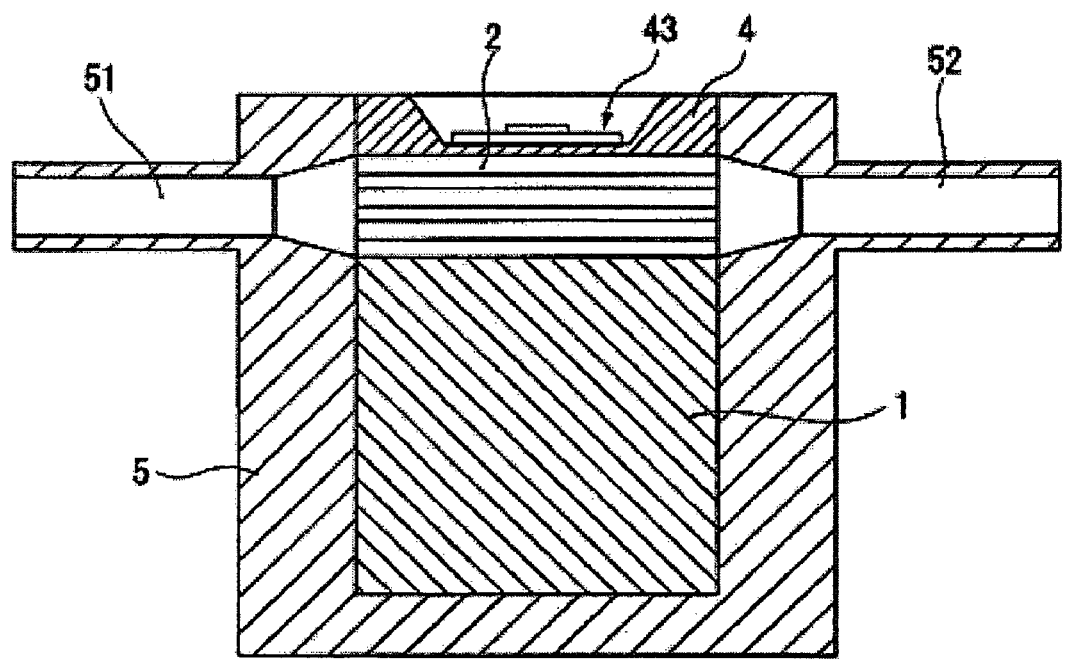
FIG. 24 is a modification of the microchannel structure in any one of the embodiments of the invention.

For example, as shown in FIG. 24, it is also possible that a groove 43 with the bottom thereof closed is formed in the top plate 4 instead of the opening 41 and the LED chip 3 is arranged at the bottom of the groove 43. In such a case, although thermal conductivity is lower than that in the constitution in which the LED chip 3 is arranged directly on the pipe array 2, it is possible to prevent fluid flowing into the spaces among the pipes 21 from leaking to the outside of the microchannels.

In the projector in the eighth embodiment, the liquid crystal light bulb is adopted as a light modulation element. However, it is also possible to adopt a micro mirror array device or the like as light modulating means. In the projector, light is projected on the projection screen using the projection lens. However, it is also possible to use a projection mirror instead of the projection lens.

The entire disclosure of Japanese Patent Application Nos: 2005-063612, filed Mar. 8, 2005 and 2005-329858, filed Nov. 15, 2005 are expressly incorporated by reference herein.

What is claimed is:

1. A microchannel structure comprising:
   plural microchannels through which fluid flows, the microchannels having a housing section formed in a block; and
   a pipe array arranged in each housing section and formed by stacking plural pipes, each pipe having a surface, the surface of each of the pipes being in contact with the surface of an adjacent pipe,
   wherein the fluid is fed to an inside of the pipes and spaces among the pipes.

2. The microchannel structure according to claim 1, wherein a sectional shape of the housing section orthogonal to a flowing direction of the fluid is gradually narrowed toward a bottom of the microchannels.

3. The microchannel structure according to claim 1, wherein a part of a surface of the pipe array is formed as a mounting area for a solid light-emitting light source that generates heat and emits light.

4. The microchannel structure according to claim 3, wherein the mounting area for the pipe array is planarized.

5. The micro channel structure according to claim 3, further comprising a fixing section in which an opening corresponding to the mounting area is formed and that is fixed to the block to fix the pipe array.

6. The microchannel structure according to claim 1, further comprising a mounting plate, one surface side of which is formed as a mounting area for a solid light-emitting light source that generates heat and emits light and the other surface side of which is made capable of coming into close contact with the pipe array.

7. The microchannel structure according to claim 1, wherein the plural pipes are in surface contact with one another.

8. The microchannel structure according to claim 7, wherein a sectional shape of the pipes is a polygonal shape.

9. The microchannel structure according to claim 1, wherein a sealing material having thermal conductivity higher than thermal conductivity of the fluid is filled among the pipes.

10. The microchannel structure according to claim 1, wherein thin pipes having a diameter smaller than that of the pipes or bar members having a diameter smaller than that of the pipes are set among the pipes.

11. The microchannel structure according to claim 1, wherein plural through-holes are formed in the pipes.

12. The microchannel structure according to claim 11, wherein the through-holes are formed in the pipes other than the pipes at the uppermost stage in the housing section.

13. A light source device comprising:
a solid light-emitting light source that emits light and generates heat when an electric current is supplied thereto; and
a base on which the solid light-emitting light source is mounted,
wherein the microchannel structure according to claim 1 is used as the base.

* * * * *